(12) United States Patent
Huang

(10) Patent No.: US 11,172,567 B2
(45) Date of Patent: Nov. 9, 2021

(54) ASSEMBLY METHOD AND DEVICE FOR CIRCUIT STRUCTURAL MEMBER AND CIRCUIT STRUCTURAL MEMBER

(71) Applicant: XI'AN ZHONGXING NEW SOFTWARE CO., LTD., Shaanxi (CN)

(72) Inventor: Zhulin Huang, Guangdong (CN)

(73) Assignee: XI'AN ZHONGXING NEW SOFTWARE CO., LTD., Shaanxi (CN)

( * ) Notice: Subject to any disclaimer, the term of this patent is extended or adjusted under 35 U.S.C. 154(b) by 0 days.

(21) Appl. No.: 16/646,609

(22) PCT Filed: Jun. 8, 2018

(86) PCT No.: PCT/CN2018/090368
§ 371 (c)(1),
(2) Date: Mar. 12, 2020

(87) PCT Pub. No.: WO2019/052237
PCT Pub. Date: Mar. 21, 2019

(65) Prior Publication Data
US 2020/0267829 A1    Aug. 20, 2020

(30) Foreign Application Priority Data

Sep. 13, 2017  (CN) .......................... 201710823223.1

(51) Int. Cl.
*H05K 1/00*    (2006.01)
*H05K 1/02*    (2006.01)
(Continued)

(52) U.S. Cl.
CPC .......... *H05K 1/0204* (2013.01); *H05K 3/305* (2013.01)

(58) Field of Classification Search
CPC .......... H05K 1/00; H05K 1/02; H05K 1/0204; H05K 1/0206; H05K 3/0005; H05K 3/30;
(Continued)

(56) References Cited

U.S. PATENT DOCUMENTS

| 5,920,112 A | 7/1999 | Datri et al. |
| 6,195,267 B1 | 2/2001 | MacDonald, Jr. et al. |

(Continued)

FOREIGN PATENT DOCUMENTS

| CN | 1358411 A | 7/2002 |
| CN | 102169865 A | 8/2011 |

(Continued)

OTHER PUBLICATIONS

WIPO, International Search Report dated Aug. 10, 2018.

*Primary Examiner* — Xiaoliang Chen
(74) *Attorney, Agent, or Firm* — Cantor Colburn LLP

(57) ABSTRACT

An assembly method and device for a circuit structural member, and a circuit structural member. The assembly method comprises: measuring a depth and path of a channel between at least one chip and a printed circuit board (PCB), the at least one chip being arranged on the PCB; determining a thickness and path of a heat dissipation reinforcement material according to the depth and path of the channel between the at least one chip and the PCB and a predetermined heat dissipation parameter, so as to configure a dispensing parameter and a dispensing path; coating the heat dissipation reinforcement material in the channel between the at least one chip and the PCB according to the dispensing parameter and dispensing path; and heating the heat dissipation reinforcement material to a first predetermined temperature, such that the heat dissipation reinforcement material permeates into the chip and the PCB.

10 Claims, 5 Drawing Sheets

(51) Int. Cl.

| | |
|---|---|
| *H05K 3/30* | (2006.01) |
| *H01L 21/02* | (2006.01) |
| *H01L 21/56* | (2006.01) |
| *H01L 21/3205* | (2006.01) |
| *H01L 23/00* | (2006.01) |
| *H01L 23/24* | (2006.01) |
| *H01L 23/28* | (2006.01) |
| *H01L 23/31* | (2006.01) |
| *H01L 23/34* | (2006.01) |
| *H01L 23/42* | (2006.01) |
| *H01L 23/373* | (2006.01) |
| *H01L 23/535* | (2006.01) |
| *H01L 23/538* | (2006.01) |

(58) Field of Classification Search
 CPC ......... H05K 3/305; H01L 21/02; H01L 21/56; H01L 21/3205; H01L 23/00; H01L 23/24; H01L 23/28; H01L 23/31; H01L 23/34; H01L 23/42; H01L 23/373; H01L 23/535; H01L 23/538
 USPC ......... 361/748, 699, 718; 174/258; 257/706, 257/712, 737, 778, 787; 369/111
 See application file for complete search history.

(56) References Cited

U.S. PATENT DOCUMENTS

| | | | |
|---|---|---|---|
| 9,406,579 | B2 | 8/2016 | Choi et al. |
| 9,406,583 | B2* | 8/2016 | Kim .................... H01L 23/3736 |
| 2011/0174526 | A1* | 7/2011 | Takematsu .......... H01L 23/5389 174/258 |
| 2011/0204497 | A1 | 8/2011 | Matsuda et al. |
| 2015/0303130 | A1* | 10/2015 | Kim ....................... H01L 24/17 257/737 |

FOREIGN PATENT DOCUMENTS

| | | |
|---|---|---|
| CN | 103426835 A | 12/2013 |
| CN | 104823276 A | 8/2015 |
| CN | 105023886 A | 11/2015 |

\* cited by examiner

ASSEMBLY METHOD AND DEVICE FOR CIRCUIT STRUCTURAL MEMBER AND CIRCUIT STRUCTURAL MEMBER

FIELD OF THE INVENTION

The present disclosure relates to the technical field of heat dissipation, and in particular, to an assembly method and device for a circuit structural member and a circuit structural member.

BACKGROUND

With the increasing demand of a user for higher performance of processing chips of an electronic device, a number of cores of a main processor of the electronic device are increased from 1 or 2 to 8, and even high up to 10. These increased circuit elements may result in a non-linear increase in power consumption and also may cause more heat to be generated by the electronic device.

Electronic devices usually adopt a passive heat dissipation mode, namely, performing heat exchange by means of heat convection of heat dissipation material and heat dissipation structure to take away heat.

A typical heat dissipation process for a CPU chip on an electronic device includes the following modes: 1) coating a heat dissipation silica gel on a surface of a chip to contact with an external heat dissipation middle frame; 2) arranging a heat dissipation copper pipe on a surface area of the CPU chip, where the heat dissipation copper pipe is embedded into the heat dissipation middle frame for heat exchange. Both of the above are performed by adding a heat dissipation material to a front surface of the CPU chip.

It can be seen that the heat dissipation of the electronic device is mainly realized by adding a heat dissipation structure to a CPU chip and a Printed Circuit Board (PCB). Addition of more heat dissipation structures will inevitably occupy more PCB layout area However, the layout area of the PCB on the electronic device is very limited. If more PCB layout area is used to add a heat dissipation structure, a space used by the chip on the PCB will need to be occupied. This will necessarily result in an increased manufacture cost of the electronic device. Therefore, the technical problem of improving a heat dissipation performance of the electronic device on the premise of not occupying more PCB layout area needs to be solved urgently.

SUMMARY

The present disclosure provides an assembly method and device for a circuit structural member and a circuit structural member.

According to an embodiment of the present disclosure, there is provided an assembly method for a circuit structural member, including steps of: measuring a depth and path of a channel between at least one chip and a PCB, the at least one chip being arranged on the PCB; determining a thickness and path of a heat dissipation reinforcement material according to the depth and path of the channel between the at least one chip and the PCB and a predetermined heat dissipation parameter so as to configure a dispensing parameter and a dispensing path; coating the heat dissipation reinforcement material in the channel between the at least one chip and the PCB according to the dispensing parameter and the dispensing path; and heating the heat dissipation reinforcement material to a first predetermined temperature such that the heat dissipation reinforcement material permeates into the chip and the PCB.

According to an embodiment of the present disclosure, there is provided an assembly device for a circuit structural member, including: a measuring device, a computing device, a dispensing device and a heating device, wherein the measuring device is connected with the computing device through a data transmission channel, and the computing device is connected with the dispensing device through a data transmission channel; the measuring device being configured to measure a depth and path of a channel between at least one chip and a PCB, the at least one chip being arranged on the printed circuit board PCB; the computing device being configured to determine the thickness and path of the heat dissipation reinforcement material, according to the depth and path of the channel between the at least one chip and the PCB and a predetermined heat dissipation parameter, so as to configure a dispensing parameter and a dispensing path; the dispensing device being configured to coat the heat dissipation reinforcement material in the channel between the at least one chip and the PCB according to the dispensing parameter and dispensing path; and the heating device being configured to heat the heat dissipation reinforcement material to a first predetermined temperature such that the heat dissipation reinforcement material permeates into the chip and the PCB.

According to an embodiment of the present disclosure, there is provided a circuit structural member, including: at least one chip, a printed circuit board PCB, a support frame and a heat dissipation reinforcement material, wherein the at least one chip is assembled on the PCB, the heat dissipation reinforcement material is coated in a channel between the at least one chip and the PCB, and the heat dissipation reinforcement material permeates into the chip and the PCB; and the PCB is assembled on the support frame, the heat dissipation reinforcement material is coated on at least one contact surface between the PCB and the support frame, and the heat dissipation reinforcement material permeates into the PCB and the support frame.

BRIEF DESCRIPTION OF THE DRAWINGS

The drawings described herein are intended to provide a further understanding of the present disclosure, which forms a part of the present disclosure. The embodiments of the present disclosure serve to explain the present disclosure with reference to the drawings which are not intended to limit the present disclosure.

DETAILED DESCRIPTION OF THE EMBODIMENTS

In order to make the objectives, technical schemes and advantages of the disclosure apparent and better to understand, the embodiments of the present disclosure will be described in detail below with reference to the accompanying drawings. It should be noted that, in the case of no conflict, the features in the embodiments and the embodiments in the present disclosure may be arbitrarily combined with each other.

Steps illustrated in the block diagram may be performed in a computer system such as a set of computer-executable instructions. In addition, although a logical order is shown in the block diagram, in some cases, the steps as shown or described may be performed in a different order than here.

Figure 1:
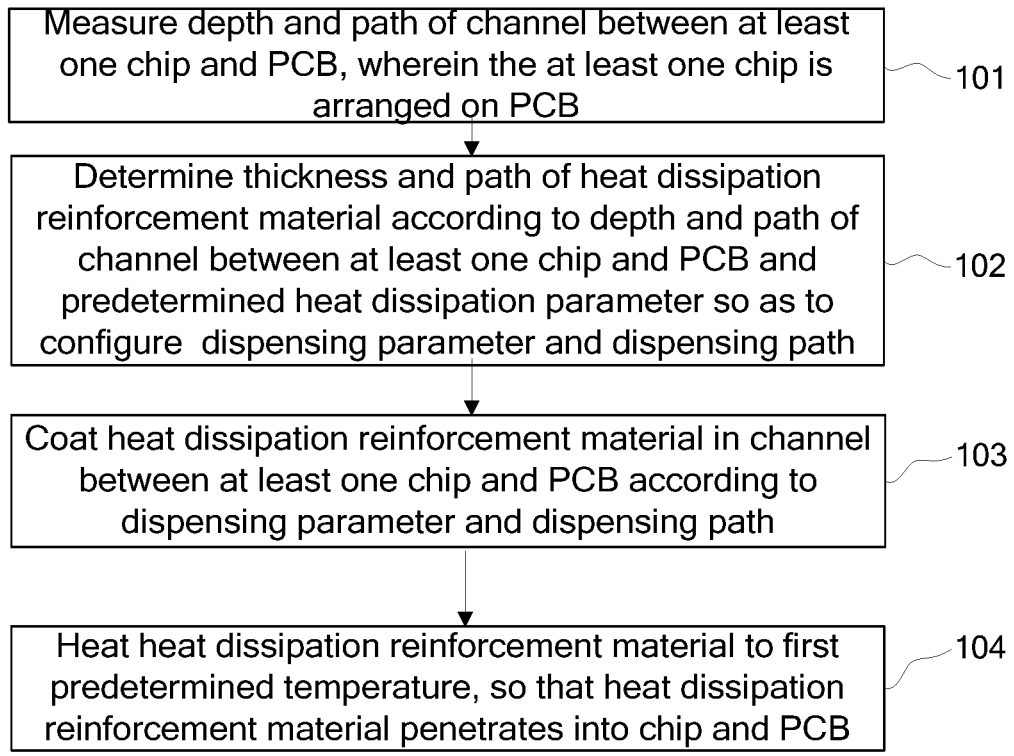
FIG. 1 is a block diagram of an assembly method for a circuit structural member according to an embodiment of the disclosure.

As shown in FIG. 1, the present disclosure provides a method for assembling a circuit structural member, including Step 101 to Step 104:

Step 101, measuring a depth and path of a channel between at least one chip and a PCB, wherein the at least one chip is arranged on the PCB;

Step 102, determining a thickness and path of a heat dissipation reinforcement material according to the depth and path of the channel between the at least one chip and the PCB and a predetermined heat dissipation parameter, so as to configure a dispensing parameter and a dispensing path;

Step 103, coating the heat dissipation reinforcement material in the channel between the at least one chip and the PCB according to the dispensing parameter and the dispensing path; and Step 104, heating the heat dissipation reinforcement material to a first predetermined temperature such that the heat dissipation reinforcement material penetrates into the chip and the PCB.

In usual cases, a channel for reinforcement is provided around the chip, and the channel is generally used for coating positioning glue. In the present disclosure, the heat dissipation reinforcement material is coated by means of a channel provided around the chip on the PCB. On one hand, the chip can be fixed; on the other hand, a heat dissipation area of the chip can be increased. Heat generated by the chip is led out through the heat dissipation reinforcement material, such that the heat dissipation performance is improved on the premise of not occupying the layout area of the PCB. The method provided in the present disclosure has strong operability and can achieve the purposes of fixing the chip and improving heat dissipation efficiency at the same time. A circuit structural member of an electronic device (such as a mobile phone) is able to be assembled by the method, without additionally increasing complexity of the hardware layout and the structural design of the PCB.

In the present disclosure, the dispensing parameter configured by the computing device may include, but is not limited to, a dispensing thickness, a dispensing area, a thermal conductivity of a material, a dispensing quality per unit time of a dispenser, a dispensing path controlled by a manipulator, a heating temperature, and the like of the PCB.

After step 104, the method may further include the steps of: coating the heat dissipation reinforcement material on at least one contact surface between the PCB and a support frame; assembling the PCB on the support frame; and heating the heat dissipation reinforcement material coated on the contact surface between the PCB and the support frame to the first predetermined temperature, such that the heat dissipation reinforcement material permeates into the PCB and the support frame. Therefore, according to this embodiment, by coating the heat dissipation reinforcement material on the contact surface between the PCB and the support frame and injecting the heat dissipation reinforcement material into the channel of the at least one chip on the PCB, the chip and the PCB can be fixed and the heat dissipation area of the PCB can be increased, and thereby achieving a better heat dissipation effect.

In practical application, the dispenser itself is provided with a gas valve and provides a means of filling a glue (like a syringe piston). In order to make the glue flow out smoothly, the glue needs to be heated to a certain temperature to be in a fluid state. The dispensing thickness may be empirically determined.

In practical application, at least one contact surface between the PCB and the support frame is a side surface of the PCB. That is, the heat dissipation reinforcement material may be coated on at least one side surface of the PCB. On one hand, the PCB can be fixed on the support frame through the heat dissipation reinforcement material; on the other hand, the heat of the PCB can be conducted to the support frame through the heat dissipation reinforcement material, thereby achieving the effect of heat dissipation of the PCB.

For example, four side surfaces of the PCB may be coated with the heat dissipation reinforcement material, or any three selected from the four side surfaces of the PCB may be coated with the heat dissipation reinforcement material, or even any two selected from the four side surfaces of the PCB may be coated with the heat dissipation reinforcement material. Of course, any one may be selected from the four side surfaces of the PCB to be coated with the heat dissipation reinforcement material. In this regard, the heat dissipation reinforcement material may be coated according to actual heat dissipation requirements, which is not limited herein.

In practical application, at least one chip on the PCB may be selected, and the heat dissipation reinforcement material may be coated in the channel between the selected chip and the PCB. Therefore, on one hand, the chip can be fixed; on the other hand, heat generated by the chip can be conducted to the PCB through the heat dissipation reinforcement material. The heat is conducted to the outside of the PCB through a heat dissipation structure arranged on the PCB or a heat dissipation reinforcement material on the side surface of the PCB, such that the heat dissipation performance of the PCB is improved on the premise of not occupying more layout area of the PCB.

In practical application, some of the chips to be heat dissipated can be selected, and a heat dissipation reinforcement material is coated in a channel around the chip. For example, the at least one chip may include: a CPU chip, a radio frequency chip and a power management chip. That is, the heat dissipation reinforcement material may be coated in the channel of one, any two or three of the CPU chips, the radio frequency chip and the power management chip. On one hand, the chips can be fixed on the PCB; on the other hand, the heat generated by the chips can be transferred to the PCB, such that the heat is dissipated through a heat dissipation structure or a heat dissipation material on the PCB.

In practical application, the heat dissipation reinforcement material may be a material that can perform both the fixing function and the heat dissipation function. For example, the heat dissipation reinforcement material may be a thermally conductive gel or other similar material. Here, the thermally conductive gel having a characteristic of hardness varying with temperature is a nano-molecular material. At a normal temperature, the hardness of the thermally conductive gel is low, and the size of the internal molecules is small. Therefore, the thermally conductive gel is easy to form an external contour of the heat dissipation object, such that the thermally conductive gel can permeate into the tiny groove of the surface material of the object from which heat is to be dissipated, and the thermally conductive gel comes into full contact with the tiny groove and is shaped arbitrarily. When the thermally conductive gel is heated to reach the morphological change threshold of the thermally conductive gel, the heated surface layer molecules gradually increase in size and are in close contact with the surface material molecules of the chip, and the inner layer molecules still keep good flexibility in heat conductivity. Heat can be dissipated through this molecular structure. Meanwhile, such molecular characteristic can play a role of fixing the chip.

During maintenance, the above assembly method provided in the present disclosure may further include: cooling the heat dissipation reinforcement material to a second predetermined temperature, such that a connection of the heat dissipation reinforcement material with the chip and the PCB is weakened to be ineffective; and detaching the chip from the PCB, where a molecular structure of the heat dissipation reinforcement material can be rapidly contracted at the second predetermined temperature, such that a rigid connection of the molecules of the heat dissipation reinforcement material with the chip and the PCB is weakened to be ineffective. Thus, it is very easy to detach the chip from the PCB. When maintenance is finished, the assembly can be carried out again by coating the heat dissipation reinforcement material in the channel. Therefore, the detachment of the chip is easy to be operated during maintenance, and the device will not be damaged.

When maintenance is required, the above assembly method provided in the present disclosure may further include: cooling the heat dissipation reinforcement material on the contact surface between the PCB and the support frame to the second predetermined temperature, such that a connection of the heat dissipation reinforcement material with the PCB and the support frame is weakened to be ineffective; and detaching the PCB from the support frame, while at the second predetermined temperature, the molecular structure of the heat dissipation reinforcement material can be rapidly contracted, such that a rigid connection of the molecules of the heat dissipation reinforcement material with the PCB and the support frame is weakened to be ineffective. Thus, the PCB can be very easily detached from the support frame. When the maintenance is finished, the PCB can be assembled again by coating the heat dissipation reinforcement materials on the contact surface between the PCB and the support frame. Therefore, the detachment of the chip is easy to be operated during maintenance, and the device will not be damaged.

Figure 2:
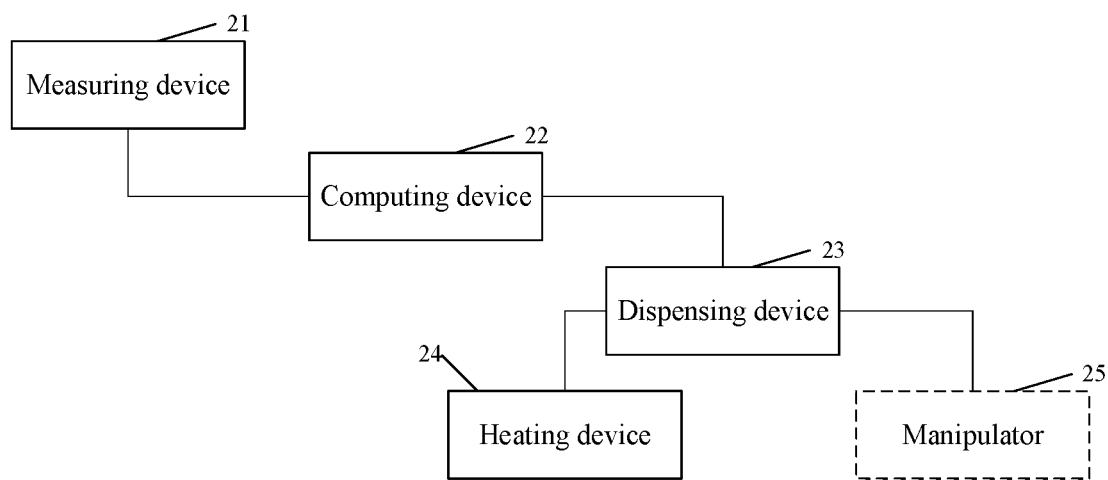
FIG. 2 is a schematic diagram illustrating a structure of an assembly device for a circuit structural member according to an embodiment of the disclosure.

In the present disclosure, there is further provided an assembly device for a circuit structural member, as shown in FIG. 2, including: a measuring device 21, a computing device 22, a dispensing device 23 and a heating device 24, wherein the measuring device 21 is connected with the computing device 22 through a data transmission channel, and the computing device 22 is connected with the dispensing device 23 through the data transmission channel;

the measuring device 21 being configured to measure a depth and path of a channel between at least one chip and the PCB, the at least one chip being arranged on the printed circuit board PCB;

the computing device 22 being configured to determine a thickness and path of a heat dissipation reinforcement material according to the depth and path of the channel between the at least one chip and the PCB and a predetermined heat dissipation parameter so as to configure a dispensing parameter and a dispensing path;

the dispensing device 23 being configured to coat the heat dissipation reinforcement material in the channel between the at least one chip and the PCB according to the dispensing parameter and the dispensing path; and the heating device 24 being configured to heat the heat dissipation reinforcement material to a first predetermined temperature, such that the heat dissipation reinforcement material penetrates into the chip and the PCB.

In an exemplary embodiment, the assembly device for the circuit structural member may further include a manipulator 25. In an exemplary embodiment, the dispensing device 23 may be further configured to coat the heat dissipation reinforcement material on at least one contact surface between the PCB and the support frame; the manipulator 25 may be further configured to assemble the PCB on the support frame; and the heating device 24 may be further configured to heat the heat dissipation reinforcement material coated on the contact surface between the PCB and the support bracket to the first predetermined temperature, such that the heat dissipation reinforcement material permeates into the PCB and the support frame.

In usual cases, a channel for reinforcement is provided around the chip, and the channel is generally used for coating positioning glue. With the assembly device for the circuit structural member of the present disclosure, a heat dissipation reinforcement material may be coated by means of a channel provided around a chip on a PCB. On one hand, the chip can be fixed; on the other hand, a circuit structural member with a larger heat dissipation area can be assembled, and the heat dissipation performance of the circuit structural member is improved on the premise that the PCB layout area is not occupied. The assembly device for the circuit structural member can automatically complete the assembly of the circuit structural member. A circuit structural member of an electronic device (such as a mobile phone) is able to be assembled without additionally increasing complexity of the hardware layout and the structural design of the PCB.

In practical application, at least one contact surface between the PCB and the support frame is a side surface of the PCB. That is, a heat dissipation reinforcement material may be coated, by a dispensing device 23, on at least one side surface of the PCB. On one hand, the PCB can be fixed on the support frame through the heat dissipation reinforcement material; on the other hand, the heat of the PCB can be conducted to the support frame through the heat dissipation reinforcement material, thereby achieving the objective of dissipating the heat of the PCB. For example, by the dispensing device 23, four side surfaces of the PCB may be coated with the heat dissipation reinforcement material, or any three selected from the four side surfaces of the PCB may be coated with the heat dissipation reinforcement material, or even any two selected from the four side surfaces of the PCB may be coated with the heat dissipation reinforcement material. Of course, any one may be selected from the four side surfaces of the PCB to be coated with the heat dissipation reinforcement material. In this regard, the heat dissipation reinforcement material may be coated according to actual heat dissipation requirements, which is not limited herein.

In practical application, at least one chip on the PCB may be selected by a measuring device 21, to measure a depth and path of a channel between the selected chip and the PCB, such that the heat dissipation reinforcement material may be coated in the channel between the selected chip and the PCB. Therefore, on one hand, the chip can be fixed; on the other hand, heat generated by the chip can be conducted to the PCB through the heat dissipation reinforcement material. The heat is conducted to the outside of the PCB through a heat dissipation structure arranged on the PCB or a heat dissipation reinforcement material on the side surface of the PCB, such that the heat dissipation performance of the PCB is improved on the premise of not occupying more layout area of the PCB.

In practical application, some of the chips to be heat dissipated can be selected, and the heat dissipation reinforcement material is coated in the channel around the chip. For example, the at least one chip may include at least one of: a CPU chip, a radio frequency chip and a power management chip, or a combination thereof. That is, the heat dissipation reinforcement material may be coated in the channel of one, any two or three of the CPU chips, the radio frequency chip and the power management chip. On one hand, the chip can be fixed on the PCB; on the other hand, the heat generated by the chip can be transferred to the PCB, such that the heat is dissipated through the heat dissipation structure or the heat dissipation material on the PCB.

In practical application, the heat dissipation reinforcement material may be a material that can perform both the fixing function and the heat dissipation function. For example, the heat dissipation reinforcement material may be a thermally conductive gel or other similar material.

In an exemplary embodiment, the heating device 24 may further be configured to cool the heat dissipation reinforcement material to the second predetermined temperature, such that a connection of the heat dissipation reinforcement material with the chip and the PCB is weakened to be ineffective; and the manipulator 25 may further be configured to detach the chip from the PCB, while at the second temperature, the molecular structure of the heat dissipation reinforcement material can be rapidly contracted at the second predetermined temperature, such that a rigid connection of the molecules of the heat dissipation reinforcement material with the chip and the PCB is weakened to be ineffective. Thus, it is very easy to detach the chip from the PCB. When maintenance is finished, the assembly can be carried out again by coating the heat dissipation reinforcement material in the channel. Therefore, the detachment of the chip is easy to be operated during maintenance, and the device will not be damaged.

In an exemplary embodiment, the heating device 24 may further be configured to cool the heat dissipation reinforcement material on the contact surface between the PCB and the support frame to the second predetermined temperature, such that the connection of the heat dissipation reinforcement material with the PCB and the support frame is weakened to be ineffective; and the manipulator 25 may further be configured to detach the PCB from the support frame, while at the second predetermined temperature, the molecular structure of the heat dissipation reinforcement material can be rapidly contracted, such that the rigid connection of the molecules of the heat dissipation reinforcement material with the PCB and the support frame is weakened to be ineffective. Thus, the PCB can be very easily detached from the support frame. When the maintenance is finished, the PCB can be assembled again by coating the heat dissipation reinforcement materials on the contact surface between the PCB and the support frame. Therefore, the detachment of the chip is easy to be operated during maintenance, and the device will not be damaged.

In practical application, the heating device 24 may be a wind gun or the like.

Figure 3:
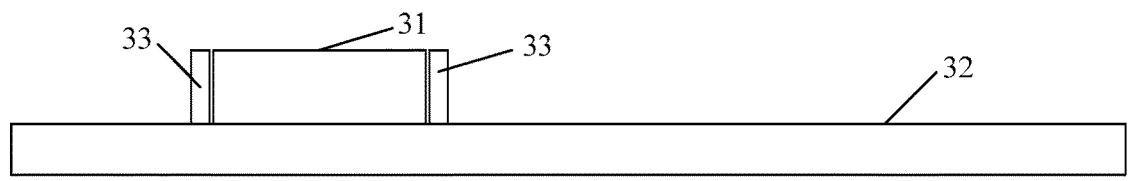
FIG. 3 is a schematic diagram illustrating a structure of a circuit structural member according to an embodiment of the disclosure.

As shown in FIG. 3, in the present disclosure, there is further provided a circuit structural member, including: at least one chip 31, a PCB 32, a support frame (not shown) and a heat dissipation reinforcement material 33, wherein the at least one chip 31 is assembled on the PCB 32, the heat dissipation reinforcement material 33 is coated in a channel between the at least one chip 31 and the PCB 32, and the heat dissipation reinforcement material 33 permeates into the chip 31 and the PCB 32; the PCB 32 is assembled on the support frame, the heat dissipation reinforcement material 33 is coated on at least one contact surface between the PCB 32 and the support frame, and the heat dissipation reinforcement material 33 permeates into the PCB 32 and the support frame.

In an exemplary embodiment, the at least one contact surface between the PCB 32 and the support frame may be a side surface of the PCB 32, for example, four side surface, any one of the four side surface or any two of the four side surface. Of course, it may also be any one of the four side surfaces of the PCB. In this regard, the heat dissipation reinforcement material may be coated according to actual heat dissipation requirements, which is not limited herein.

In an exemplary embodiment, the at least one chip 31 may include at least one of: a CPU chip, a radio frequency chip and a power management chip, or a combination thereof.

In an exemplary embodiment, the heat dissipation reinforcement material 33 may be a material that can perform both the fixing function and the heat dissipation function at the same time. For example, the heat dissipation reinforcement material may be a thermally conductive gel or other similar material.

In practical application, the aforesaid circuit structural member can be applied to various kinds of electronic devices such as a mobile phone, a wearable device, a tablet, etc.

The following describes the circuit structural member and an assembly process thereof in detail by taking a mobile phone as an example.

Figure 4:
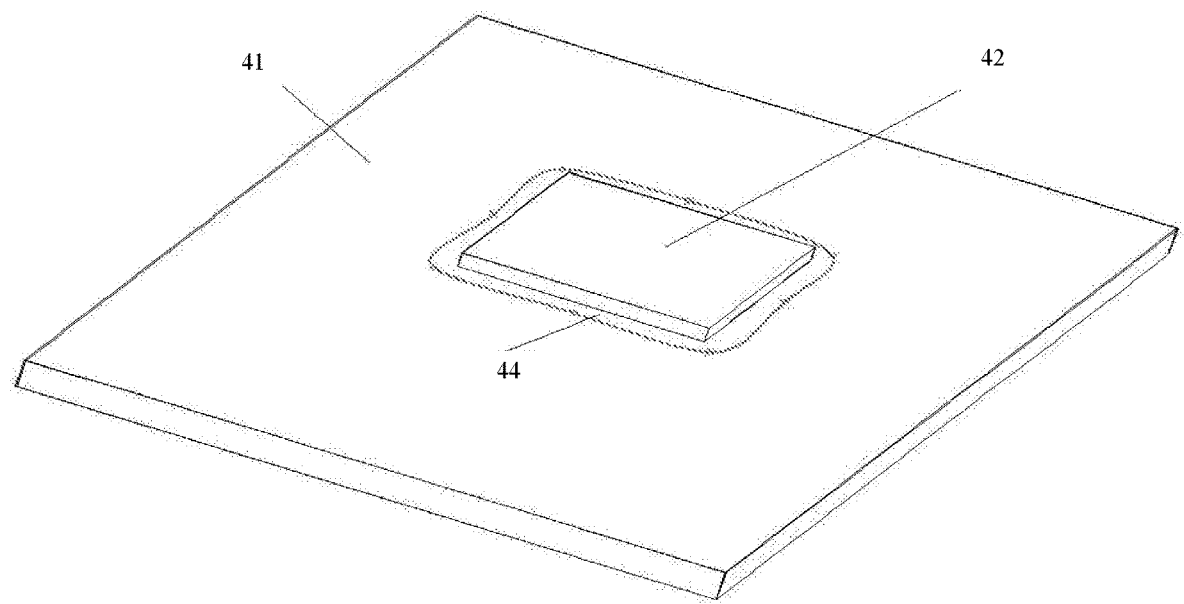
FIG. 4 is a schematic diagram of a chip channel reserved on a mobile device (e.g., a mobile phone)

A channel(s) is reserved on the PCB of the mobile phone for the CPU chip. In this embodiment, a thermally conductive gel can be injected through the pre-reserved groove of the CPU chip. Under the condition, the thermally conductive gel can perform the function of fixing the CPU chip and can improve the heat dissipation effect. As shown in FIG. 4, the circuit structural member of the mobile phone may include: a support frame (not shown in FIG. 4), a PCB 41, a CPU chip 42 and a thermally conductive gel. In this embodiment, the four sides of the PCB 41 are coated with the thermally conductive gel which is also injected into the channel 44 around the CPU chip.

In this embodiment, the process of assembling the circuit structural member of the mobile phone may include the following Step 1 to Step 8.

Step 1: the measuring device measures a depth and path of the channel 44 around the CPU chip 42, the CPU chip 42 being welded on the PCB 41.

Step 2: the computing device determines a thickness and path of the thermally conductive gel based on the depth and path of the channel 44 around the CPU chip 42 and a predetermined heat dissipation parameter.

Here, the computing device determines the thickness of the thermally conductive gel injected into the channel 44 according to the conversion formula of the thickness of the thermally conductive gel and the heat dissipation efficiency in combination with the depth and path of the channel 44, and then calculates the usage amount of the thermally conductive gel according to the thickness to set the dispensing parameter and path of the dispensing device.

In practical application, the thickness of the thermally conductive gel injected within the channel 44 may be adjusted based on a gap margin provided by the structure. For example, in an exemplary embodiment, a gap width may be within 0.3 mm, while a gap margin of about 0.05-0.1 mm may be reserved. Under structural stress, the glue fills the gap and thus the thermally conductive gel is injected into the channel 44.

Figure 5:
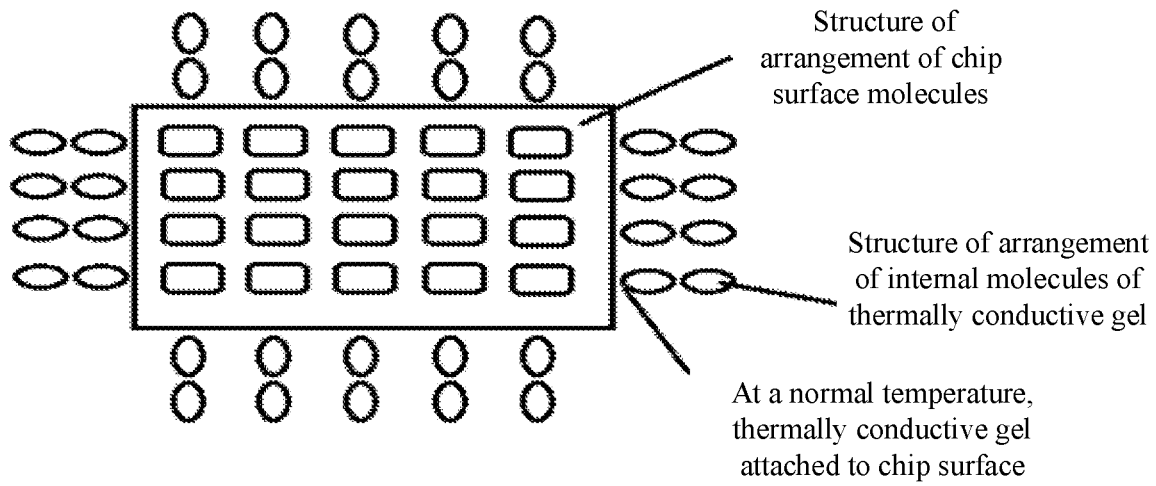
FIG. 5 is a schematic diagram illustrating a structure of an arrangement of thermally conductive gel molecules and chip surface molecules at a normal temperature.

Step 3: the dispensing device performs a dispensing operation on the channel 44 around the CPU chip 42 according to the dispensing parameter and path. Since the dispensing thickness is configured in advance, the thermally conductive gel injected by the dispensing device into the channel 44 at this time can meet the desired requirement. At a normal temperature, the thermally conductive gel is in a soft state, and in the state, the molecular size of the thermally conductive gel is small and the thermally conductive gel can be attached to the outer surface of the chip. FIG. 5 shows a schematic diagram of a structure of an arrangement of thermally conductive gel molecules and chip surface molecules at a normal temperature.

Step 4: the heating device performs a short-time heating treatment on the thermally conductive gel in the channel 44 to a first predetermined temperature, such that the thermally conductive gel permeates into the CPU chip 42 and the PCB 41 to connect and fix the CPU chip 42 and the PCB 41.

Figure 6:
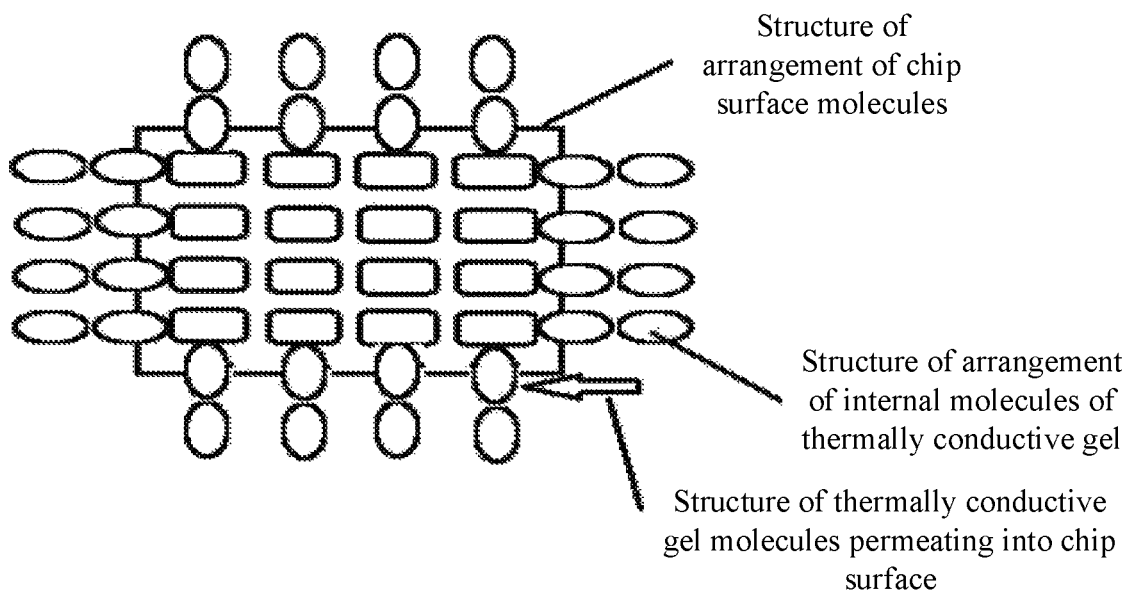
FIG. 6 is schematic diagram illustrating a structure of a thermally conductive gel permeating into chip surface molecules.
Figure 7:
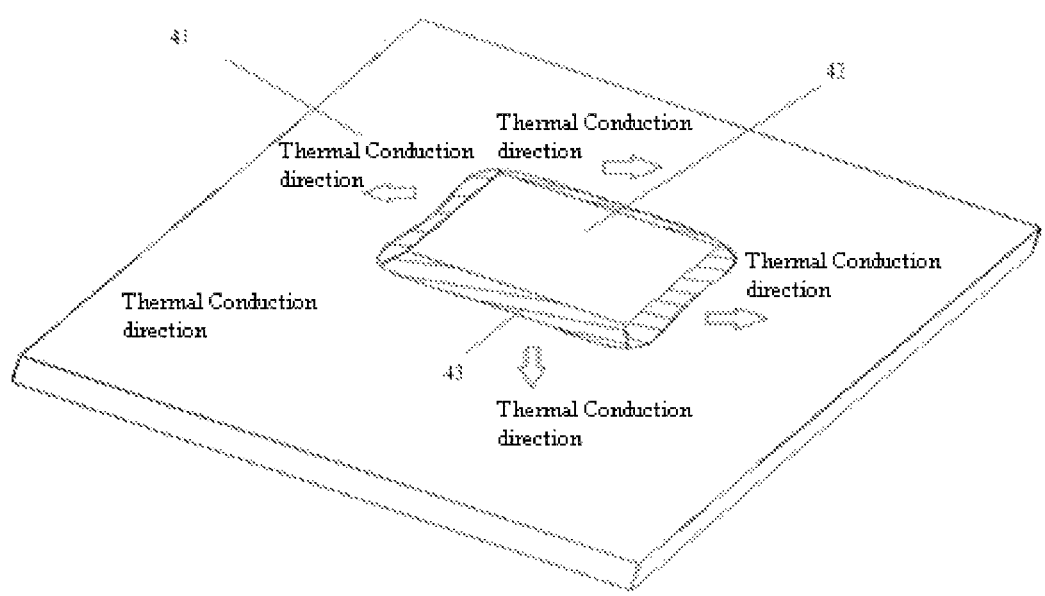
FIG. 7 is a schematic diagram illustrating heat conduction between a PCB and a CPU chip.

Here, the heating device is pre-configured with a value of the first predetermined temperature. The heating device heats the thermally conductive gel to the first predetermined temperature during the heating treatment, and then the heating is automatically stopped. Here, the value of the first predetermined temperature is a first temperature threshold value at which the morphology of the thermally conductive gel changes. After the thermally conductive gel is heated to the temperature threshold, the size of the surface layer molecules of the thermally conductive gel is increased, such that the molecules of the thermally conductive gel permeate into the molecular structure on the chip surface and are fused together. Thus, the thermally conductive gel gradually becomes a rigid structure, but inner layer molecules maintain good thermal conductivity characteristics. FIG. 6 shows a schematic diagram of a structure of the thermally conductive gel permeating into the chip surface molecular after heating to the first temperature threshold. The fused structure is very stable in state, and rigid in connection, which performs the function of fixing the CPU chip 42. FIG. 7 shows a schematic diagram of the thermal conduction between the PCB and the CPU chip after this step. Due to the molecules inter-permeation in the microstructure, the heat of the package surface of the CPU chip 42 is conducted to the PCB 41 having a large amount of copper material therein through the inner layer molecules of the thermal conductive gel 43. Thus, the heat dissipation effect of the CPU chip 42 is enhanced.

In practical application, a main heat generating device on the PCB 41, such as the radio frequency chip (not shown in FIG. 4), a power management chip (not shown in FIG. 4), etc., can be injected with the thermally conductive gel in the channel thereof in the manners of Step 1 to Step 3. On one hand, the corresponding device can be fixed; on the other hand, the heat dissipation effect of the corresponding device can be enhanced. In addition, by injecting the thermally conductive gel into the channels of the plurality of heat generating devices, a heat dissipation surface with a larger area can be formed on the PCB 41, further enhancing the heat dissipation efficiency of the PCB 41.

Step 5: a layer of thermally conductive gel is coated on the contact surface between the peripheral edge of the PCB 41 and the support frame by the glue dispensing device.

Step 6: the PCB 41 is assembled on the support frame by the manipulator.

Step 7: the thermally conductive gel coated on the edge of the PCB 41 is heated by a heating device for a short time to the first predetermined temperature such that the thermally conductive gel 43 permeates into the support frame and the PCB 41 to connect and fix the support frame and the PCB 41.

Figure 8:
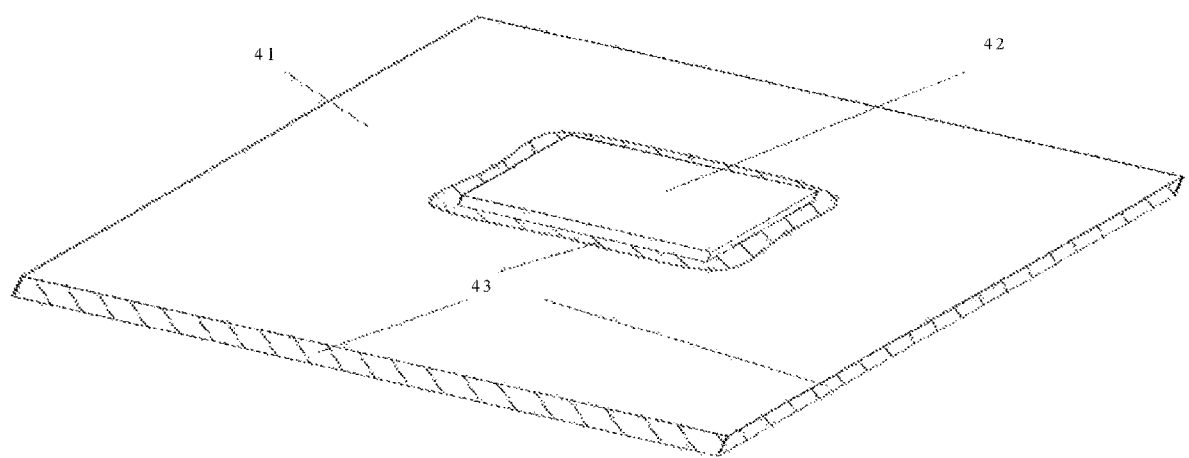
FIG. 8 is a schematic diagram of a channel on a PCB and sides thereof coated with a thermally conductive gel.

Thus, on one hand, the PCB 41 can be fixed on the support frame through the thermally conductive gel; on the other hand, the heat dissipation surface of the PCB can be enlarged, and another heat dissipation channel is established besides the traditional heat dissipation path on the top of the chip. Therefore, the heat dissipation speed of the whole mobile phone can be increased, and the heat treatment efficiency of the mobile phone is improved. As shown in FIG. 8, the diagonal line area on the edge of the PCB 41 is an area where the thermally conductive gel 43 is coated on the PCB and the support frame.

Figure 9:
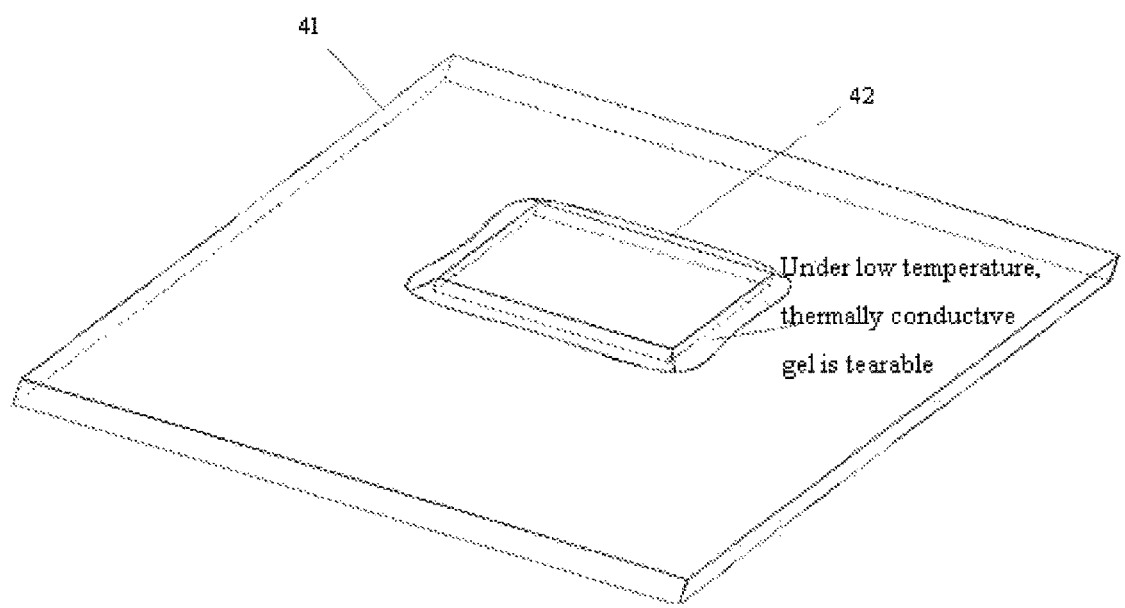
FIG. 9 is a schematic diagram of a thermally conductive gel in a tearable state at a low temperature.

Step 8: when the CPU chip 42 needs to be maintained, the heating device cools the thermally conductive gel injected therein along the track of the channel 44 to a second predetermined temperature. The thermally conductive gel is withdrawn from the surface molecular array of the CPU chip 42, forming a tearable state. The CPU chip 42 is torn off the PCB 41 by the manipulator, and the CPU chip 42 can be detached from the PCB 41. FIG. 9 shows a schematic diagram of a thermally conductive gel in a tearable state at a low temperature.

In practical applications, the second predetermined temperature is a second temperature threshold of the morphology change of the thermally conductive gel. When the temperature of the thermally conductive gel is lower than the second temperature threshold, the molecular structure of the thermally conductive gel is contracted rapidly, and the rigid connection with other molecules is weakened to be ineffective.

In practical application, after the above steps are completed, the detached CPU chip 42 may be reassembled by the above operations.

The circuit structural member of the mobile phone can be formed through the above assembly process, the thermally conductive gel is coated in a channel of the heating chip on the PCB of the circuit structural member, and the thermally conductive gel is also coated on the side face of the PCB. Therefore, under the condition of not occupying the layout area of the PCB, the heat dissipation surface on the PCB in the circuit structural member is increased, thereby improving the heat dissipation efficiency of the circuit structural member and further enhancing the heat dissipation performance of the mobile phone.

It will be appreciated by those skilled in the art that all or part of the steps of the above method may be implemented by a program instructing an associated hardware (e.g., a processor), and the program may be stored in a computer readable storage medium, such as a read-only memory, a magnetic disk or an optical disk, and the like. Optionally, all or part of the steps of the above embodiments may also be implemented using at least one integrated circuit. Accordingly, the modules/units in the above embodiments may be implemented in the form of a hardware, for example, using an integrated circuit, or using a software functional module to implement their corresponding functions, for example, using a processor to execute a program/instruction stored in a memory to implement their corresponding functions. The present disclosure is not limited to any specific form of combination of hardware and software.

The above shows and describes general principles, essential features and advantages of the present disclosure. The present disclosure is not to be limited by the above embodiments, which are presented only for illustrating the principles of the disclosure. Without departing from the spirit and scope of the present disclosure, the present disclosure may have various variations and improvements, and these variations and improvements all fall within the scope of the disclosure.

The invention claimed is:

1. An assembly method of a circuit structural member, comprising steps of:
measuring a depth and path of a channel between at least one chip and a printed circuit board (PCB), the at least one chip being arranged on the PCB;
determining a thickness and path of a heat dissipation reinforcement material according to the depth and path of the channel between the at least one chip and the PCB and a predetermined heat dissipation parameter so as to configure a dispensing parameter and a dispensing path;
coating the heat dissipation reinforcement material in the channel between the at least one chip and the PCB according to the dispensing parameter and the dispensing path; and
heating the heat dissipation reinforcement material to a first predetermined temperature, such that the heat dissipation reinforcement material permeates into the chip and the PCB.

2. The assembly method according to claim 1, further comprising:
coating the heat dissipation reinforcement material on at least one contact surface between the PCB and a support frame;
assembling the PCB on the support frame; and
heating the heat dissipation reinforcement material coated on the contact surface between the PCB and the support frame to the first predetermined temperature, such that the heat dissipation reinforcement material permeates into the PCB and the support frame.

3. The assembly method according to claim 2, wherein the at least one contact surface between the PCB and the support frame is a side surface of the PCB.

4. The assembly method according to claim 1, wherein the at least one chip comprises at least one of: a CPU chip, a radio frequency chip, and a power management chip, or a combination thereof.

5. The assembly method according to claim 1, wherein the heat dissipation reinforcement material is a thermally conductive gel.

6. An assembly device for a circuit structural member, comprising: a measuring device, a computing device, a dispensing device and a heating device, wherein the measuring device is connected with the computing device through a data transmission channel, and the computing device is connected with the dispensing device through the data transmission channel, wherein
the measuring device is configured to measure a depth and path of a channel between at least one chip and a printed circuit board (PCB), the at least one chip being disposed on the PCB;
the computing device is configured to determine a thickness and path of the heat dissipation reinforcement material according to the depth and path of the channel between the at least one chip and the PCB and a predetermined heat dissipation parameter, so as to configure a dispensing parameter and a dispensing path;
the dispensing device is configured to coat the heat dissipation reinforcement material in the channel between the at least one chip and the PCB according to the dispensing parameter and the dispensing path; and
the heating device is configured to heat the heat dissipation reinforcement material to a first predetermined temperature such that the heat dissipation reinforcement material permeates into the chip and the PCB.

7. The assembly device according to claim 6, further comprising a manipulator, wherein
the dispensing device is further configured to coat the heat dissipation reinforcement material on at least one contact surface between the PCB and the support frame;
the manipulator is configured to mount the PCB on a support frame; and
the heating device is further configured to heat the heat dissipation reinforcement material coated on the contact surface between the PCB and the support frame to the first predetermined temperature, such that the heat dissipation reinforcement material permeates into the PCB and the support frame.

8. The assembly device according to claim 7, wherein the at least one contact surface between the PCB and the support frame is a side surface of the PCB.

9. The assembly device according to claim 6, wherein the at least one chip comprises at least one of: a CPU chip, a radio frequency chip, and a power management chip, or a combination thereof.

10. The assembly device according to claim 6, wherein the heat dissipation reinforcement material is a thermally conductive gel.

* * * * *